(12) United States Patent
Shin et al.

(10) Patent No.: US 9,961,762 B2
(45) Date of Patent: May 1, 2018

(54) CIRCUIT BOARD FOR COF PACKAGE

(71) Applicant: SILICON WORKS CO., LTD., Daejeon-si (KR)

(72) Inventors: Ju Young Shin, Daejeon (KR); Jung Bae Yun, Daejeon-si (KR); Yong Jung Kwon, Cheongju-si (KR); Jeung Hie Choi, Cheongju-si (KR)

(73) Assignee: SILICON WORKS CO., LTD., Daejeon-si (KR)

( * ) Notice: Subject to any disclaimer, the term of this patent is extended or adjusted under 35 U.S.C. 154(b) by 0 days. days.

(21) Appl. No.: 15/408,644

(22) Filed: Jan. 18, 2017

(65) Prior Publication Data

US 2017/0208679 A1   Jul. 20, 2017

(30) Foreign Application Priority Data

Jan. 19, 2016 (KR) .......... 10-2016-0006303

(51) Int. Cl.

| | |
|---|---|
| *H05K 1/02* | (2006.01) |
| *H01L 23/498* | (2006.01) |
| *H01L 23/50* | (2006.01) |
| *H01L 25/18* | (2006.01) |
| *H01L 51/00* | (2006.01) |
| *H05K 1/18* | (2006.01) |

(52) U.S. Cl.

CPC ....... *H05K 1/0216* (2013.01); *H01L 23/4985* (2013.01); *H01L 23/49838* (2013.01); *H01L 23/50* (2013.01); *H01L 25/18* (2013.01); *H01L 51/00* (2013.01); *H05K 1/0228* (2013.01); *H05K 1/189* (2013.01); *H05K 2201/10106* (2013.01); *H05K 2201/10128* (2013.01)

(58) Field of Classification Search

CPC ....... H01L 2224/16; H01L 2224/01079; H01L 2924/01078; H01L 2924/15311; H01L 2224/01; H01L 2224/02125

See application file for complete search history.

(56) References Cited

U.S. PATENT DOCUMENTS

| | | | |
|---|---|---|---|
| 8,302,067 B2 * | 10/2012 | Lee | ............ H01L 23/49838 716/137 |
| 8,648,477 B2 | 2/2014 | Kim | |

FOREIGN PATENT DOCUMENTS

| | | |
|---|---|---|
| KR | 10-0665184 | 1/2007 |
| KR | 10-2007-0033507 | 3/2007 |
| KR | 10-0864639 | 10/2008 |
| KR | 10-2014-0050831 | 4/2014 |

* cited by examiner

*Primary Examiner* — Quoc Hoang
(74) *Attorney, Agent, or Firm* — Kile Park Reed & Houtteman PLLC

(57) ABSTRACT

The present invention relates to a circuit board for COF (Chip on Film) package, which is capable of preventing an influence of coupling noise on a core block of an integrated circuit. The circuit board may include: a base film defined a core block region overlapping a predetermined location of a core block within an integrated circuit and having the same area as or larger area than the core block; first routing patterns formed on the base film; and a first block pattern covering the core block region. The first routing patterns may be formed outside the first block pattern at the same layer as the first block pattern.

7 Claims, 2 Drawing Sheets

CIRCUIT BOARD FOR COF PACKAGE

BACKGROUND

1. Technical Field

The present disclosure relates to a circuit board for COF (Chip on Film) package, and more particularly, to a circuit board for COF package, where routing patterns for transmitting signals or power are formed and an integrated circuit is mounted.

2. Related Art

Recently, flat panel display devices using a variety of light sources have been released on the market. Representative examples of the flat panel display devices may include an OLED (Organic Light Emitting Diode) display device.

The OLED display device is a self-luminous display device that displays an image using an OLED.

In general, the OLED display device includes a plurality of pixels, a display panel configured to display an image, a driving unit configured to display a driving signal to the display panel, and a power supply unit configured to supply a voltage for image display and a voltage for operation to the display panel and the driving unit, respectively.

The driving unit may be divided into a timing controller, a source driver and a gate driver, and embodied by a packaged chip or integrated circuit. The source driver and the gate driver, which are included in the driving unit, provide a source signal and a gate signal to the display panel, and are electrically connected to a printed circuit board on which the display panel and the power supply unit are mounted in the form of a TCP (Tape Carrier Package), COF (Chip on Film) or COG (Chip on Glass) package.

Among the packages, the COF package has a structure in which an integrated circuit is mounted on a circuit board, and the circuit board has a structure in which routing patterns for transmitting a signal or power to a base film made of an insulating and flexible material are formed. The COF package has a low thermal expansion coefficient, exhibits excellent flexibility, uses a slim base film, and has the routing patterns formed at a fine pitch, compared to the TCP package. Thus, the use of the COF package is increasing.

In the COF package, the integrated circuit mounted on the circuit board may receive an external signal or power through a routing pattern of the base film, and the circuit board may include routing patterns for various uses.

The integrated circuit may be internally divided into a digital part such as a shift register and an analog part such as a buffer for processing a signal outputted from a digital-analog converter. Between the digital part and the analog part, a part sensitive to an interference of coupling noise may be defined as a core block.

When a routing pattern is formed on the circuit board corresponding to the core block of the integrated circuit mounted on the circuit board, coupling noise caused by a signal or voltage of the routing pattern may have an influence on the core block.

The coupling noise may have an influence on the operation of the core block, and serve as a factor which causes a malfunction of integrated circuit in a serious case.

In the OLED display device, the pixels of the display panel require a supply of pixel supply voltage including a high-potential pixel supply voltage EVDD or low-potential pixel supply voltage EVSS for their operations. The supply of the pixel supply voltage needs to be implemented on the COF package having a limited area. Thus, the above-described coupling noise is highly likely to have an influence on the operation of the core block in the integrated circuit.

Therefore, there is a demand for design of a circuit board which is capable of preventing an interference with the core block of the integrated circuit mounted on the circuit board.

SUMMARY

Various embodiments are directed to a circuit board for COF package, which is capable of improving the structure of routing patterns on a base film and preventing an influence of coupling noise on a core block of an integrated circuit implemented as a package, the coupling noise being caused by signals or voltages of routing patterns.

In an embodiment, a circuit board for COF package may include: a base film defined a core block region overlapping a predetermined location of a core block within an integrated circuit and having the same area as or larger area than the core block; first routing patterns formed on the base film; and a first block pattern covering the core block region. The first routing patterns may be formed outside the first block pattern at the same layer as the first block pattern.

DETAILED DESCRIPTION

Figure 1:
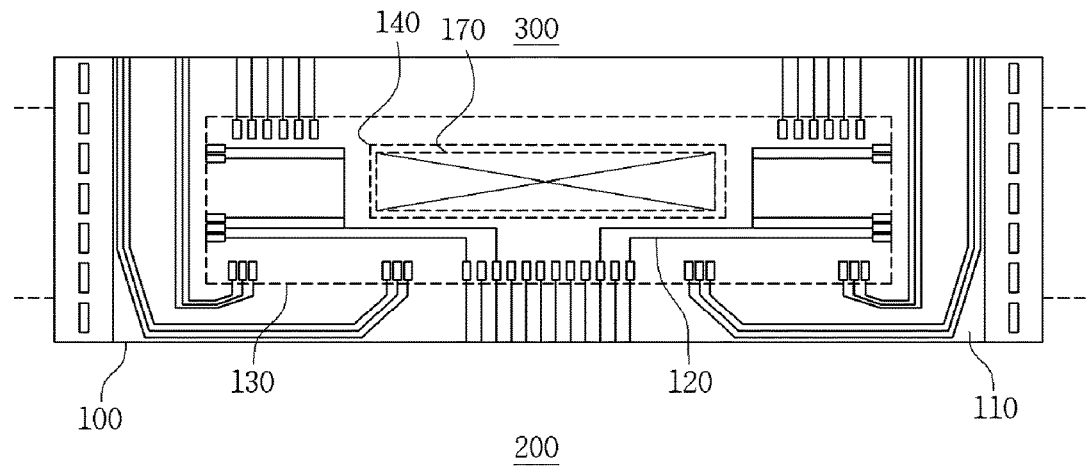
FIG. 1 is a diagram illustrating a circuit board for COF package according to an embodiment of the present invention.

Hereafter, embodiments of the present invention will be described in detail with reference to the accompanying drawings. The terms used in the present specification and claims are not limited to typical dictionary definitions, but must be interpreted into meanings and concepts which coincide with the technical idea of the present invention.

Embodiments described in the present specification and configurations illustrated in the drawings are preferred embodiments of the present invention, and do not represent the entire technical idea of the present invention. Thus, various equivalents and modifications capable of replacing the embodiments and configurations may be provided at the point of time that the present application is filed.

A circuit board for COF package may be embodied as illustrated in FIG. 1.

Referring to FIG. 1, the circuit board 100 for COF package according to the embodiment of the present invention is configured to electrically connect a printed circuit board 200 and a display panel 300.

The printed circuit board 200 includes a power supply unit or signal source mounted thereon, and provides a signal and power required for driving an integrated circuit or display panel. The power supply unit and the signal source are not illustrated in FIG. 1. The signal provided from the printed circuit board 200 may include data for displaying an image and control signals for controlling operation.

The printed circuit board 200 includes conductive patterns such as contact pads or wiring lines, which are formed on a surface being in contact with the circuit board 100 for COF package, the conductive patterns serving to transmit power and signals.

The display panel 300 may include various display panels such as an organic light emitting display panel, a liquid crystal display panel and a plasma display panel. In the following descriptions, the organic light emitting display panel will be exemplified as the display panel 300.

The display panel 300 also includes conductive patterns such as contact pads or wiring lines, which are formed on a surface being in contact with the circuit board 100 for COF package, the conductive patterns serving to power and signals.

The surface of the circuit board 100 for COF package, which is in contact with the printed circuit board 200 or the display panel 300, may be electrically connected to the conductive patterns of the printed circuit board 200 or the display panel 300 through conductive paste.

The circuit board 100 for COF package may have an integrated circuit mounted on the same surface as or the opposite surface of the surface which is in contact with the printed circuit board 200 or the display panel 300. When the integrated circuit is mounted on the opposite surface of the surface which is in contact with the printed circuit board 200 or the display panel 300, the routing patterns on both surfaces of the circuit board 100 for COF package may be electrically connected through via holes.

The circuit board 100 for COF package may include a base film 110 made of an insulating and flexible material and routing patterns 120 for transmitting power or signals. The routing patterns 120 may be formed on one or more of the same surface as and the opposite surface of the surface on which the integrated circuit is mounted. For convenience of description, the present embodiment is based on the supposition that the routing patterns 120 are formed on the surface on which the integrated circuit is mounted. The routing patterns 120 formed on the base film 110 for COF package may be defined as FLR (Film Level Routing) patterns.

The base film 110 may be formed of polyimide resin, epoxy-based resin or another publicly-known insulating material, and have an insulating property and flexibility.

The routing patterns 120 may be formed on the same surface as the surface on which the integrated circuit (not illustrated) of the base film 110 is mounted, and made of a thin film pattern of a conductive metal such as copper.

The routing patterns 120 may include routing patterns that receive a signal and power from the printed circuit board 200 and transmits the received signal and power to the integrated circuit or the display panel 300 or routing patterns that provide a signal and power outputted from the mounted integrated circuit to the printed circuit board 200 or the display panel 300.

The routing patterns 120 may include various shapes of lines or pads that transmit signals or power between desired locations without overlapping each other.

When the integrated circuit is a source driver, the integrated circuit may be divided into a digital part such as a latch or shift register and an analog part such as a buffer for processing a signal outputted from a digital-analog converter.

Between the digital part and the analog part, a part sensitive to an interference of coupling noise may be defined as a core block 170. The core block 170 may be defined as all or part of blocks of the digital part, all or part of blocks of the analog part, or a block sharing part of the digital part and the analog part.

The base film 110 may include a chip region 130 and a core block region 140 which are defined on one surface thereof. The chip region 130 is a partial region of the base film 110 on which the integrated circuit is mounted, and the core block region 140 is another partial region of the base film 110, which is defined in the chip region 130 and corresponds to the core block 170 of the integrated circuit.

The core block 170 illustrated in FIG. 1 may indicate a core block mounted on the base film 110, like a chip.

Parts of the routing patterns 120 may be present inside and outside the chip region 130. In this case, the parts of the routing patterns 120, which are located in the chip region 130, may be defined as inner lead patterns, and the other parts of the routing patterns 120, which are located outside the chip region 130, may be defined as outer lead patterns.

The integrated circuit has connections embodied in the form of balls, bumps or lands on a surface facing the circuit board 100 for COF package, and is electrically connected to the routing patterns 120 through contacts between the connections and the inner lead patterns of the routing patterns 120. When the integrated circuit and the routing patterns 120 are electrically connected to each other through wire bonding, the wire bonding may be formed on the outer lead patterns of the routing patterns 120.

As described above, the circuit board 100 for COF package according to the embodiment of the present invention may include the base film 110 defined the chip region 130 where the integrated circuit is to be mounted and the core block region 140 corresponding to the predetermined location of the core block 170 in the integrated circuit, and the routing patterns formed on the base film 110.

The routing patterns 120 may be formed outside the core block region 140, and the core block region 140 may be formed as an empty region having the same area as or larger area than the core block 170 of the integrated circuit.

The routing patterns 120 of the chip region 130 may bypass the core block region 140 such that the core block region 140 of the base film 110 is formed as an empty region.

Referring to FIG. 1, the routing patterns 120 in the chip region 130 have a curved shape to bypass the core block region 140.

Thus, in the circuit board 100 for COF package according to the embodiment of the present invention, the routing patterns 120 for transmitting signals or power as illustrated in FIG. 1 are not formed at the core block region 140 on the base film 110, but the core block region 140 is formed as an empty region where the routing patterns 120 are not formed.

The core block 170 of the integrated circuit in the COF package using the circuit board according to the embodiment of the present invention is not affected by coupling noise when a signal or power is transmitted through the routing patterns 120 of the circuit board 100 for COF package.

Figure 2:
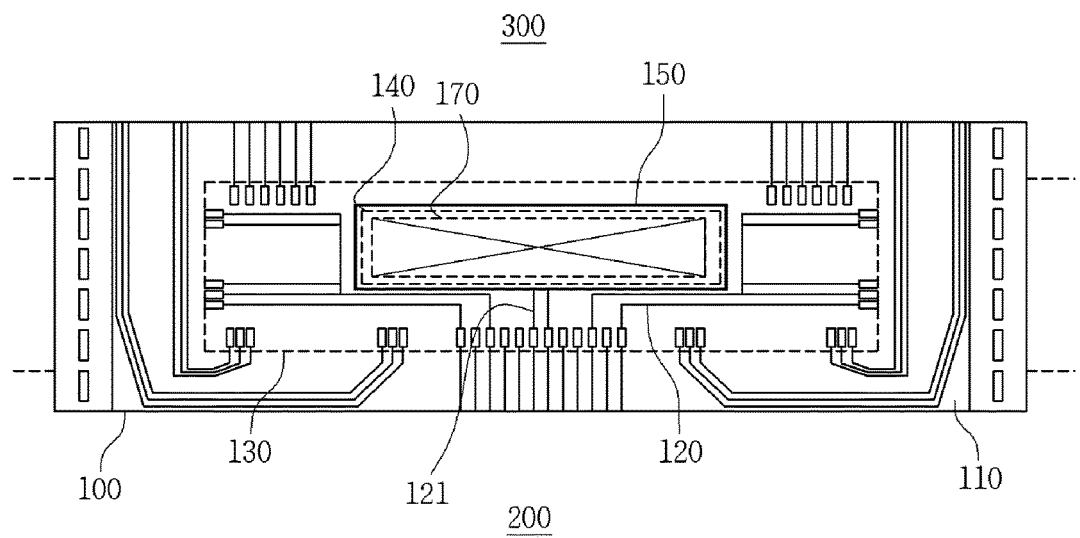
FIG. 2 is a diagram illustrating a circuit board for COF package according to another embodiment of the present invention.

The circuit board 100 for COF package according to the embodiment of the present invention may be embodied as illustrated in FIG. 2.

Referring to FIG. 2, the circuit board 100 for COF package according to the embodiment of the present invention includes a base film 110, routing patterns 120 and a core block pattern 150.

In the configuration of FIG. 2, the descriptions of the same components and functions as those of FIG. 1 are omitted.

Referring to FIG. 2, the circuit board 100 for COF package according to the embodiment of the present invention includes the core block pattern 150 capable of covering the entire core block region 140, unlike the configuration of FIG. 1.

The core block pattern 150 is formed over the base film 110 so as to overlap the core block region 140. The core block pattern 150 is formed of the same conductive material as the routing pattern.

The core block pattern 150 may be set in a floating state where no voltage is applied, or apply a specific voltage such as a common voltage used in an integrated circuit. At this time, a voltage of which the level is stably retained may be selected as the specific voltage.

The core block pattern 150 may be connected to a routing pattern 121 so as to receive a voltage. For example, a routing pattern 121 for applying a common voltage may be electrically connected to a specific voltage application terminal of the printed circuit board 200 or the integrated circuit.

The above-described core block pattern 150 may prevent an influence of coupling noise on the core block 170 of the integrated circuit, the coupling noise being caused by a signal or voltage of the routing pattern 120 adjacent to the core block region 140. Thus, the core block 170 of the integrated circuit may be stably operated without an influence of coupling noise.

In FIG. 2, the core block pattern 150 is formed in a rectangular shape, but may be formed in various shapes for covering the core block 170.

The core block pattern 150 may have the same area as or larger area than the core block region 140.

The core block pattern 150 may include a combination of two or more divided patterns, and each or part of the divided patterns may float or the voltage may be applied to each or part of the divided patterns.

Figure 3:
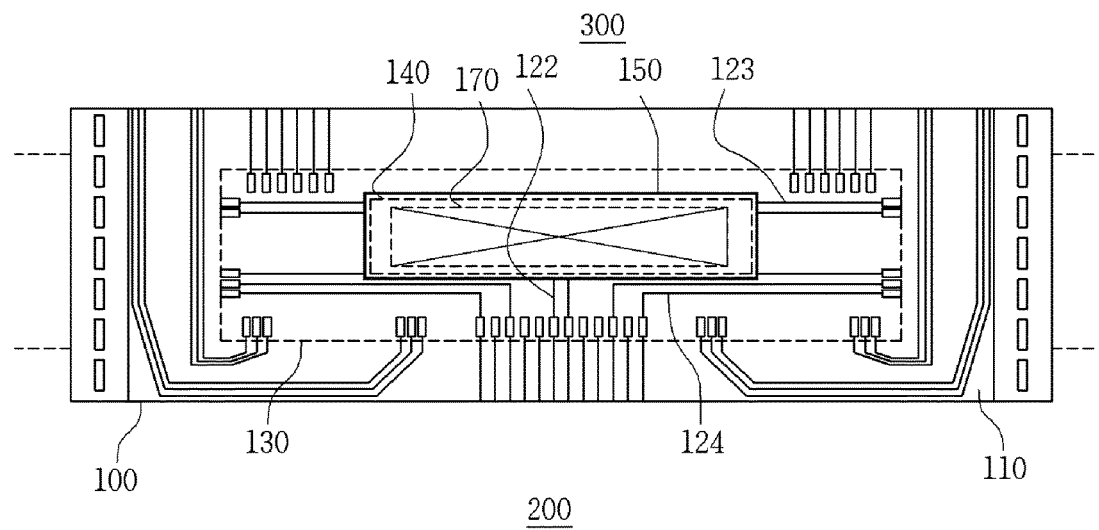
FIG. 3 is a diagram illustrating a circuit board for COF package according to still another embodiment of the present invention.

The circuit board 100 for COF package according to the embodiment of the present invention may be embodied as illustrated in FIG. 3.

Referring to FIG. 3, the circuit board 100 for COF package according to the embodiment of the present invention may include a base film 110, routing patterns 120 and a core block pattern 150. In the configuration of FIG. 3, the duplicated descriptions of the same components as those of FIG. 2 are omitted.

Referring to FIG. 3, the core block pattern 150 may be connected to part or all of the routing patterns 120, and used to transmit a signal or power. That is, a part of the routing patterns 122 may be formed to transmit a signal or power inputted to the core block pattern 150, another part of the routing patterns 123 may be formed to transmit a signal or power outputted from the core block pattern 150 to the outside, and the other routing patterns 124 may be not connected to the core block pattern 150 but bypass the block pattern 150. The core block pattern 150 may be integrated with routing patterns 122 and 124 for transmitting to the core block 170 the same signal or power which does not cause coupling noise.

The core block pattern 150 may have the same area as or larger area than the core block region 140 as illustrated in FIG. 2.

In FIGS. 2 and 3, the core block pattern 150 may be defined as a first block pattern.

Figure 4:
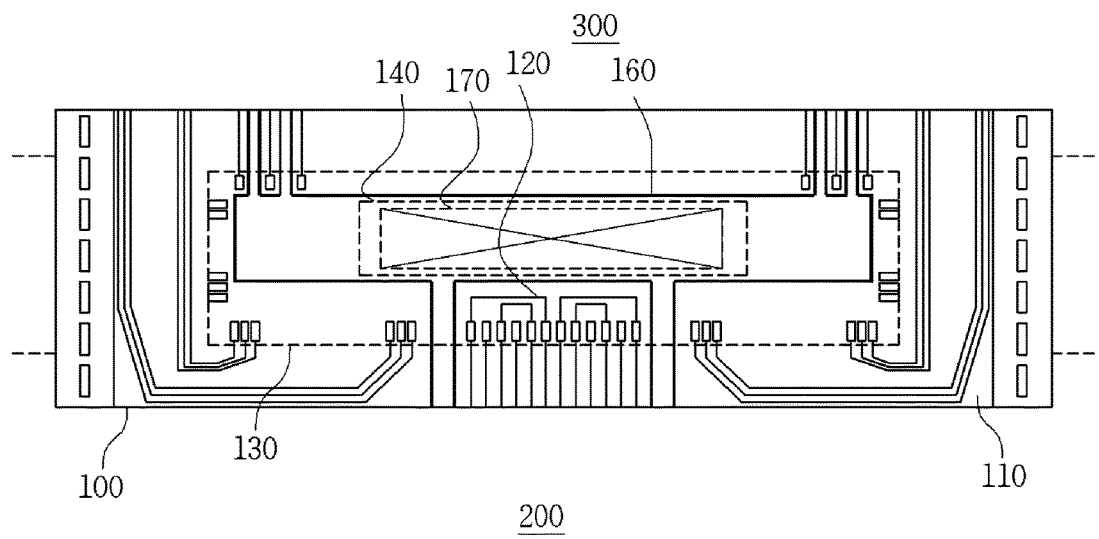
FIG. 4 is a diagram illustrating a circuit board for COF package according to still another embodiment of the present invention.

The circuit board 100 for COF package according to the embodiment of the present invention may be embodied as illustrated in FIG. 4.

Referring to FIG. 4, the circuit board 100 for COF package according to the embodiment of the present invention may include a base film 110, routing patterns 120 and a pixel supply voltage pattern 160. In the configuration of FIG. 4, the duplicated descriptions of the same components as those of FIG. 2 are omitted.

In an OLED display panel 300, the pixels of the panel 300 require a supply of pixel supply voltage including a high-potential pixel supply voltage EVDD or low-potential pixel supply voltage EVSS for their operations. Thus, the pixel supply voltage pattern 160 may be formed on the base film 110, in order to form a voltage supply path between the printed circuit board 200 and the display panel 300 to supply a pixel supply voltage from the printed circuit board 200 to the display panel 300.

The pixel supply voltage pattern 160 may include a rectangular pattern including the core block region 140 within the chip region 130 or wiring patterns diverging from the rectangular pattern so as to connect to the printed circuit board 200. At this time, when the pixel supply voltage pattern 160 is formed at the same layer as the routing patterns 120 for transmitting signals or power as illustrated in FIG. 4, the routing patterns 120 may bypass the core block region 140 and the pixel supply voltage pattern 160.

In FIG. 4, the pixel supply voltage pattern 160 may be defined as a first block pattern.

When the pixel supply voltage pattern 160 is formed at a different layer from the routing patterns 120 unlike the configuration of FIG. 4, the core block pattern 150 including the core block region 140 may be formed between the pixel supply voltage pattern 160 and the layer in which the integrated circuit is to be mounted, and prevent an influence of coupling noise caused by the pixel supply voltage pattern 160. In this case, the core block pattern 150 may be defined as a first block pattern, and the pixel supply voltage pattern 160 may be defined as a second block pattern.

According to the configurations of FIGS. 3 and 4, the core block pattern 150 can prevent an influence of coupling noise on the core block 170 of the integrated circuit while transmitting a signal or power, and the core block 170 of the integrated circuit may be stably operated without an influence of coupling noise.

According to the embodiments of the present invention, the routing patterns may be formed to bypass the core block region of the base film corresponding to the core block of the integrated circuit sensitive to an interference of coupling noise, or the block pattern capable of shielding coupling noise may be formed, which makes it possible to prevent an influence of coupling noise on the core block of the integrated circuit.

While various embodiments have been described above, it will be understood to those skilled in the art that the embodiments described are by way of example only. Accordingly, the disclosure described herein should not be limited based on the described embodiments.

What is claimed is:

1. A circuit board for COF (Chip on Film) package, comprising:
   a base film defined a core block region overlapping a predetermined location of a core block in an integrated circuit and having the same area as or larger area than the core block;
   first routing patterns formed on the base film; and
   a first block pattern covering the core block region for preventing an influence of coupling noise on the core block,
   wherein the first routing patterns are formed outside the first block pattern at the same layer as the first block pattern.

2. The circuit board of claim 1, wherein the first routing patterns comprise one or more of a second routing pattern for transmitting power and a third routing pattern for transmitting a signal.

3. The circuit board of claim 1, wherein the first block pattern is connected to a fourth routing pattern, and receives a voltage for suppressing an interference with the integrated circuit, through the fourth routing pattern.

4. The circuit board of claim 3, wherein the voltage is set to a common voltage used in the integrated circuit.

5. The circuit board of claim 1, wherein the first block pattern forms a voltage supply path for supplying a pixel supply voltage between a printed circuit board and a display panel.

6. The circuit board of claim 1, further comprising a second block pattern formed at a different layer from the first block pattern,
   wherein the second block pattern forms a voltage supply path for supplying a pixel supply voltage between a printed circuit board and a display panel.

7. The circuit board of claim 6, wherein the first block pattern is formed between the layer where the integrated circuit is mounted and the layer where the second block pattern is formed.

* * * * *